(12) United States Patent
Ravid et al.

(10) Patent No.: US 6,846,986 B1
(45) Date of Patent: Jan. 25, 2005

(54) OPTICAL MODULE GROUND STRIP

(75) Inventors: Arie Ravid, Newark, CA (US); Joshua T. Oen, Fremont, CA (US); Richard H. Hsu, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/704,103

(22) Filed: Nov. 7, 2003

(51) Int. Cl.$^7$ ................................................. H05K 5/02
(52) U.S. Cl. ................................ 174/51; 59/6; 439/98; 439/92
(58) Field of Search ............................. 174/51, 59, 60, 174/6, 35 C, 135, 40 CC; 439/98, 92, 100

(56) References Cited

U.S. PATENT DOCUMENTS

| | | | | |
|---|---|---|---|---|
| 5,896,275 A | * | 4/1999 | Gaeta et al. | 361/760 |
| 5,924,877 A | * | 7/1999 | Byrne et al. | 439/101 |
| 5,984,697 A | * | 11/1999 | Moran et al. | 439/92 |
| 6,607,393 B2 | * | 8/2003 | Raypole et al. | 439/92 |
| 6,737,582 B2 | * | 5/2004 | Van Lieu et al. | 174/53 |

* cited by examiner

*Primary Examiner*—Dhiru R. Patel
(74) *Attorney, Agent, or Firm*—Kevin A Reif

(57) ABSTRACT

RF emission may be reduced by providing grounding strips between optical transmitter and receiver modules in an optical transceiver package. The grounding strips includes an upper portion to fit over a top of the module, a transition portion to span a distance between the top of the module and the board, and a lower portion in electrical connection with a grounding pad on the board. The grounding strip may be substantially as wide as the module that it covers. Angled tabs may be provided to fit within registration holes in the ground pad. The grounding strip may be press-fitted onto the module or soldered. The low impedance ground strip increases the connectivity of the optical module to the board and may replace grounding leads to the external housing to reduce RF emissions.

22 Claims, 5 Drawing Sheets

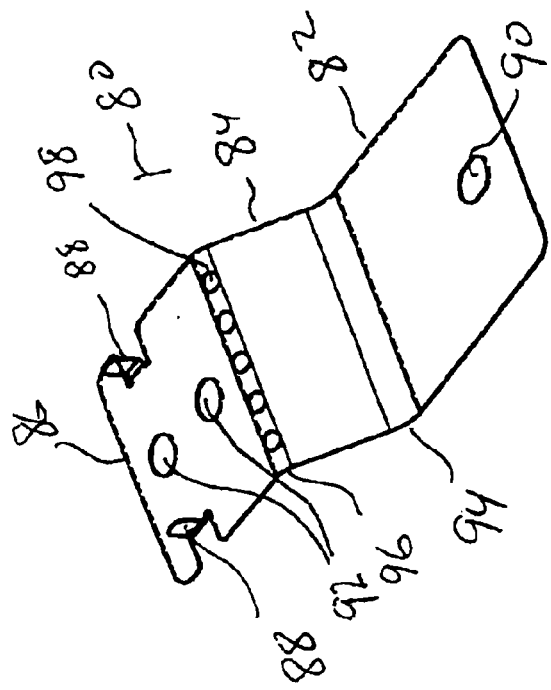
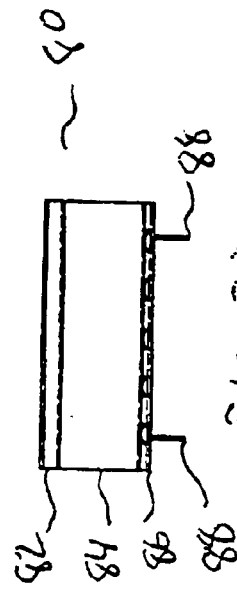
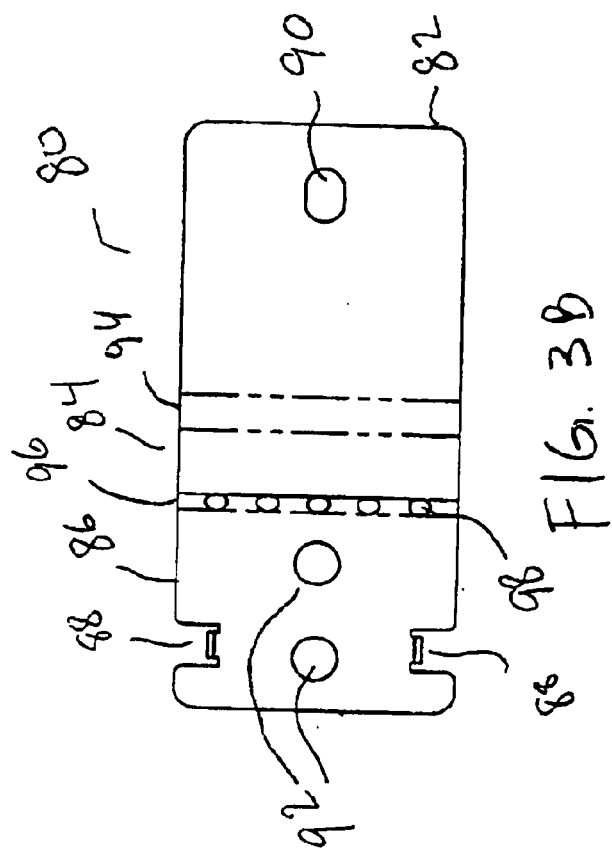
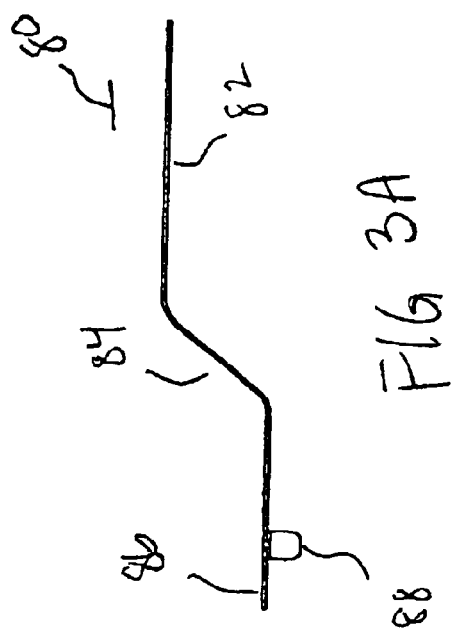

OPTICAL MODULE GROUND STRIP

FIELD OF THE INVENTION

An embodiment of the present invention relates to optical transceiver modules and, more particularly, to grounding techniques for reducing RF emissions.

BACKGROUND INFORMATION

Optoelectronics packaging is one of the most difficult and costly operations in optoelectronics manufacturing. Optoelectronic packages provide submicron alignment between optical elements, high-speed electrical connections, excellent heat dissipation, and high reliability. Providing such features has resulted in optoelectronic packages that may be larger, costlier and more difficult to manufacture than electronic packages. In addition, current designs of optoelectronic packages and associated fabrication processes are ill adapted for automation because today's high-performance butterfly packages are characterized by a large multiplicity of mechanical parts (submounts, brackets, ferrules, etc.), three-dimensional (3D) alignment requirements, and poor mechanical accessibility.

For manufacturers, the trends driving the demand for new optical packaging are providing an opportunity for reducing the cost of developing 10 Gbps application technology and a challenging market increasingly characterized by a diversity of applications. Consequently, manufacturers need an approach to component-level packaging that can be applied to both transmitter and receiver modules and to various products and applications without the need for a full redesign of each new component package. Within such an approach, manufacturers should be able to precisely align a laser chip or photodiode to single-mode fiber with high coupling efficiency and maintain this alignment, meet the RF (radio frequency), thermal, and hermetic sealing requirements and provision them for direct integration into the package for cost, space, and power savings; and simultaneously develop a low-cost automation capability for easily scalable manufacturing.

Of particular concern is the RF emission requirements. RF emissions are produced in varying degrees by virtually every type of electrical equipment. Electromagnetic shielding may be used to protect electrical equipment from this unwanted electromagnetic radiation or EMI. Many systems require at least some shielding for proper operation or to meet RF requirements for emissions and immunity. As circuit speeds and sensitivities increase so will the need for improved shielding.

Electromagnetic shielding often provides protection for electrical equipment by reducing unwanted signals to levels that do not adversely affect equipment. This is achieved by both reflecting and absorbing the radiation signals. Reflection depends on a permeability and conductivity of the shielding material, and a frequency and wave impedance of the signal. Generally, the reflectance of a shielding material increases with frequency. The remaining signal passing through a shielding material is reduced by absorption. The resistivity and thickness of the shield, effects absorption.

However, while shielding may protect RF emissions from radiating outside of a shielded module, it does little to protect other potentially sensitive components within the module or which may be radiated out of the module via an input or output lead which may act as an antenna to radiate RF emissions past the shield. Thus, rather than simply shielding, it may be desirable to reduce the overall RF emissions produced by a component.

BRIEF DESCRIPTION OF THE DRAWINGS

FIGS. 3A, 3B, 3C, and 3D are a side view, top view, bottom perspective view, and front view, respectively, of a grounding strip according to an embodiment of the invention;

DETAILED DESCRIPTION

Figure 1:
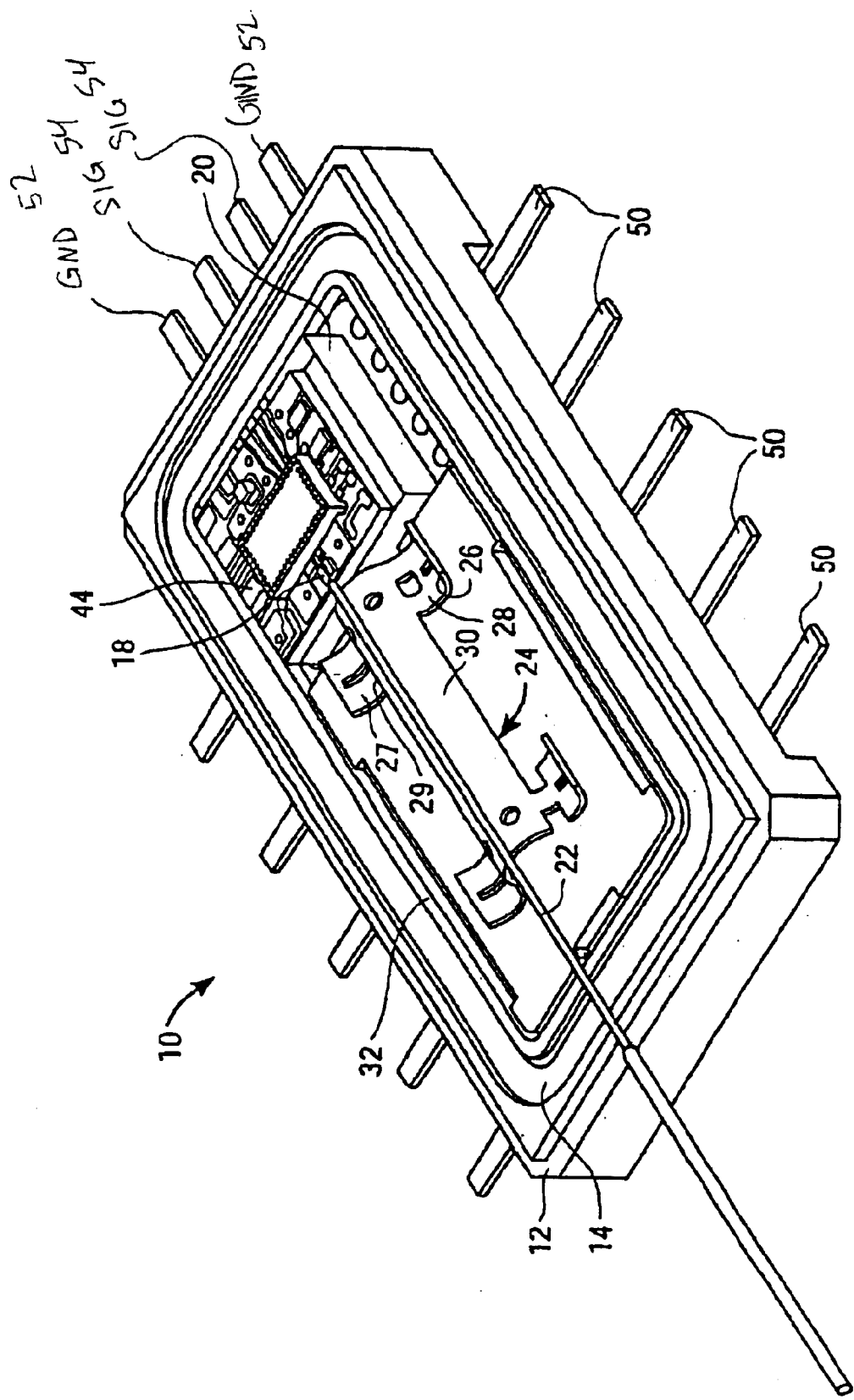
FIG. 1 shows one embodiment of an optoelectronic butterfly package assembly.

FIG. 1 shows one embodiment of an optoelectronic assembly 10 with frame 32 and flexure 24. Assembly 10 also includes a substrate 12 with positioning floor 14, which may be substantially planar and the substrate 12 comprises an electrically isolating region with a low coefficient of thermal expansion. In one embodiment, a raised platform is created on positioning floor 14.

In one embodiment, the package comprises a substrate having a positioning floor which provides a mounting surface and the package bottom wall. In one embodiment, the substrate and its positioning floor are substantially planar. In one embodiment, one or more raised platforms are also provided on the mounting surface. The raised platforms may be submounts made of a high thermal conductivity material, such as, for example, copper tungsten, Aluminum Nitride, Berillyum Oxide, Diamond, and Boron Nitride, attached to the floor of the substrate. The raised platforms may be attached, for example, by soldering or brazing, or may even be part of the substrate material itself.

Optical elements, or components, are mounted on positioning floor 14 and platform 20. In one embodiment, a lens (not shown) is mounted on substrate 12, and an edge emitting optoelectronic element 18, such as, for example, a laser diode, is mounted on platform 20. Other optical components may be used. For instance, a receiving opto electronic element 18 such as a photodiode may be used.

An optical element 22 is attached to on flexure 24, by, for example, soldering, brazing or welding. In one embodiment, flexure 24 comprises two legs 26 and 27, a body 30, and two spring regions 28 and 29 at the junction of legs 26 and 27 and body 30. In one embodiment, element 22 is a single mode optical fiber, but it may be any element that requires optical alignment with other optical elements.

A platform or frame 32 may be attached to substrate 12. The ends of legs 26 and 27 are attached to frame 32. A cap (not shown) may be attached to frame 32, thereby creating an airtight seal. In one embodiment, the cap has a top hat shape and a peripheral lip that can be hermetically sealed to the outside portion of the frame. The hermetic seal may be created by a process such as seam welding, soldering or adhesive bonding.

In one embodiment, a wire bond (not shown) connects optical element 18 to electrically conductive pattern 44 which is on the top side of platform 20 or on a substrate mounted on platform 20. Pins 50 on the bottom side of positioning floor 14 are also provided for connections to electronic component inside the package through other vias (not shown). The combination of patterns and filled vias provide an efficient and low-parasitic mechanism for hermetically distributing electrical signals from optoelectronic elements inside the hermetic enclosure to pins 50 at the periphery of package 10. Ground leads 52 and signal leads 54 may be arranged at the back end of the assembly 10.

Figure 2:
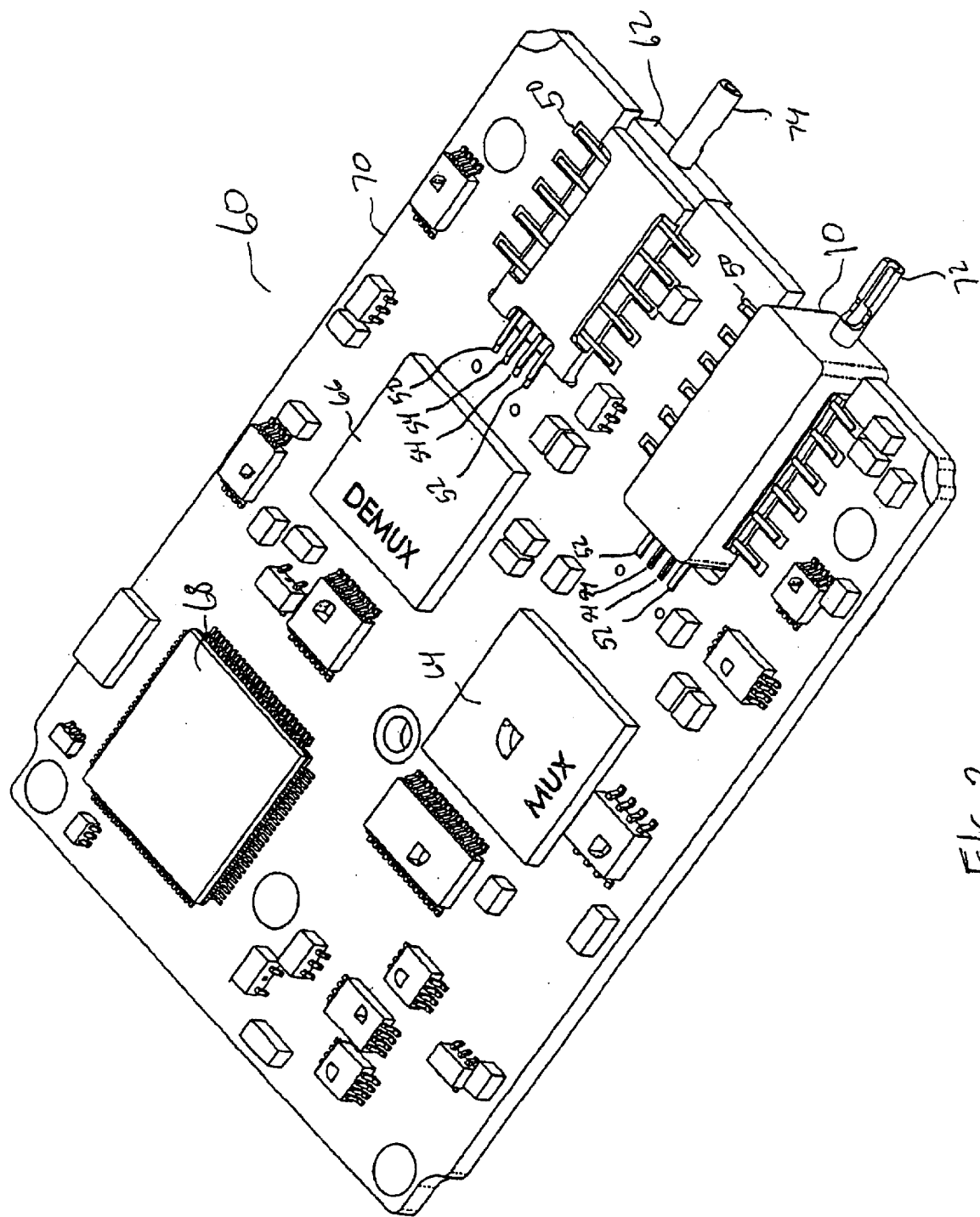
FIG. 2 is an optical transceiver with a transmitter and receiver having grounding leads.

Referring now to FIG. 2, there is shown an example optical transceiver 60 designed to provide an interface between the photonic physical layer and the electrical layer in 10 Gbps network applications. The small footprint and low power dissipation of the module makes it ideal for cost-effective, high-performance client-side interfaces in telecom as well as core-enterprise switches, routers, multi-service provisioning platforms and optical transport solutions.

The transceiver 60 provides an optical transmitter 10 and receiver 62 pair integrated with an electrical multiplexer (MUX) 64 and demultiplexer (DeMUX) 66. A variety of other support components are shown which may also present such as microprocessor 68 within the transceiver 60. The details of these additional components have been left omitted to maintain clarity.

As shown, the transmitter 10 and receiver 62 are positioned in the transceiver module 60. Both the transmitter 10 and the receiver 62 may produce RF emissions nearing the threshold of the acceptability range particularly when operating in the 10 GHz range. This may be in part due to the grounding arrangement of the transmitter 10 and receiver 62 to the assembly board 70. As illustrated there are two inner signal lines 54 adjacent to two outer ground lines 52. The EMI emissions produced by the signal lines should be canceled by the ground lines. However, since these lines may not be perfectly parallel, or uniform at higher frequencies unwanted emissions may be radiated. Further compounding this situation, the transmitter ferrule 72 and the receiver ferrule 74 may server to act as antennas radiating these unwanted emissions.

FIGS. 3A, 3B, 3C, and 3D show one embodiment of an electrically conductive, low impedance ground strip 80 to increase the grounding of the transmitter 10 and receiver 62 to the assembly board 70. FIG. 3A shows a side view of the grounding strip 80. The grounding strip is electrically conductive and may be made, for example, of gold-plated beryllium copper (BeCu). The grounding strip 80 comprises an upper portion 82 adapted to fit over either of the transmitter 10 or receiver 62, a transition portion 84 to span the vertical distance to the assembly board 70, and a lower portion 86 adapted to make electrical contact with a ground pad on the assembly board 70. Tabs 88 may be provided to insert into registration holes in the assembly board 70.

FIG. 3B shows a top view of the grounding strip 80. FIG. 3C shows a perspective view of the grounding strip 80, and FIG. 3D shows a forward looking view of the grounding strip 80. The upper portion 82 may include one or more openings or holes 90 into which solder or other adhesive may be used to secure the ground strip 80 to either the transmitter 10 or the receiver 62. Similarly, the lower portion 86 may include one or more openings or holes 92 into which solder or other adhesive may be used to secure the grounding trip 80 to the assembly board 70. The transition portion may include a first creased area 94 and a second creased area 96 at either end. One or both of the creased areas, 94 and 96, may include perforations 98. The creased areas may provide bend relief to reduce spring-back. The perforations 96 may further provide bend relief for the transition area 84.

Figure 4:
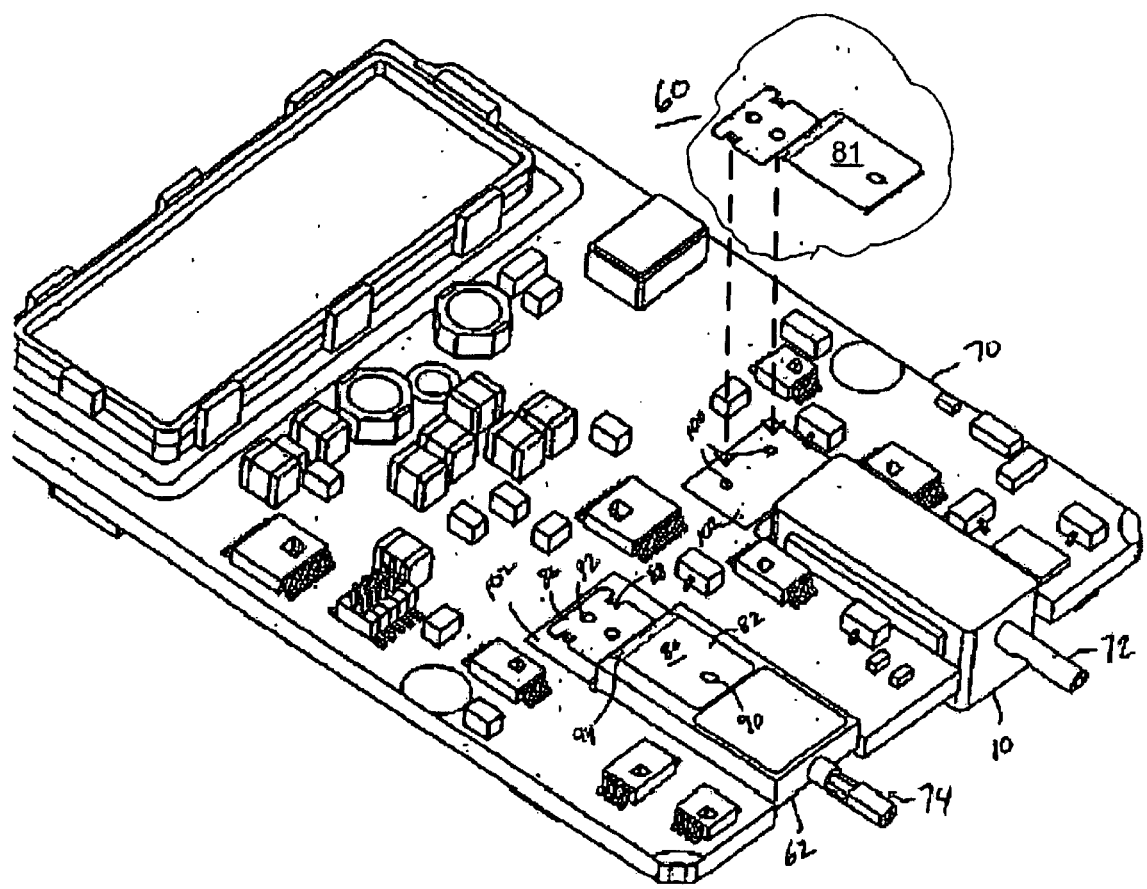
FIG. 4 is an optical transceiver with a transmitter and receiver grounded with the grounding strip according to an embodiment of the invention.

FIG. 4 shows the underside of the optical transceiver 60 shown in FIG. 2, with the grounding strip according to embodiments of the invention attached to the receiver 62. Another grounding strip 81 may also be attached to the transmitter 10. The grounding strips 80 and 81 are substantially as wide as the module (transmitter 10 or receiver 62) that it covers. The tabs 88 are angled to fit within the registration holes 100 in a ground pad 102. The grounding strip may be press-fitted onto the module (10 or 62) or, solder or other adhesive may be used in holes 90 and 92. The low impedance ground strips 80 and 81 increase the connectivity of the optical components to the board 70 as a replacement for the grounding to the external housing, and reduces the RF emission significantly. For example, prior to this ground strip implementation Transponder Emission (RF) was marginally passing UL Class B requirements. With the implementation of the ground strip 80 tests show that there was an astounding 12 dB margin over the UL Class B EMI requirements.

Figure 5:
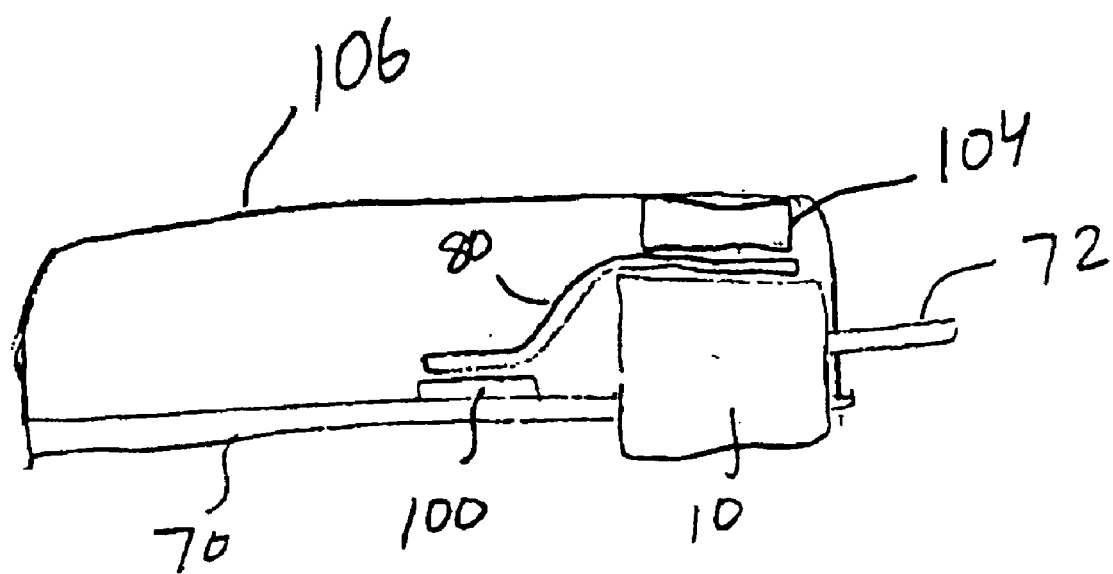
FIG. 5 is a cut away side view of the grounding strip pressed against the cover of an optical transceiver with a thermal pad.

FIG. 5 shows an example of the grounding strip 80 press fit to the module 10. In this embodiment, a thermal gap pad 104 may be placed between the ground strip 80 and a package cover 106 encasing the transceiver 60. In this case, the grounding strip 80 may also serve to dissipate heat from the module 10 and aid in conducting the heat through the thermal pad 104 and the lid 106.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An electrically conductive ground strip, comprising:
   an upper portion to fit over a top of a module;
   a transition portion to span a distance between the top of the module and a board; and
   a lower portion in electrical connection with a grounding pad on the board.

2. The electrically conductive ground strip as recited in claim 1 wherein said module is one of an optical transmitter or optical receiver.

3. The electrically conductive ground strip as recited in claim 2 wherein said upper portion, said transition portion and said lower portion are substantially as wide as either of said optical transmitter and optical receiver.

4. The electrically conductive ground strip as recited in claim 1 wherein said ground strip comprises gold-plated beryllium copper.

5. The electrically conductive ground strip as recited in claim 1 wherein the upper portion projects in a first direction from the transition portion and the lower portion projects in a second, opposite direction from the transition portion.

6. An electrically conductive ground strip, comprising:
   an upper portion to fit over a top of a module;
   a transition portion to span a distance between the top of the module and a board;
   a lower portion in electrical connection with a grounding pad on the board; and tabs on said lower portion to fit into registrations holes in the grounding pad.

7. An electrically conductive ground strip, comprising:

an upper portion to fit over a top of a module;

a transition portion to span a distance between the top of the module and a board;

a lower portion in electrical connection with a grounding pad on the board;

a thermal pad in contact with said upper portion; and a cover in contact with said thermal pad.

8. An electrically conductive ground strip, comprising:

an upper portion to fit over a top of a module;

a transition portion to span a distance between the top of the module and a board; and a lower portion in electrical connection with a grounding pad on the board, wherein said transition portion comprises at least one creased area, and wherein said at least one creased area comprises perforations.

9. An electrically conductive ground strip, comprising:

an upper portion to fit over a top of a module;

a transition portion to span a distance between the top of the module and a board; and a lower portion in electrical connection with a grounding pad on the board, wherein either of said upper portion and said bottom portion comprises solder holes.

10. A method, comprising:

connecting a module to a board;

placing an upper portion of an electrically conductive grounding strip over said module;

spanning a distance between said upper portion and said board with a transition portion of said grounding strip; and contacting a grounding pad on said board with a lower portion of said grounding strip.

11. The method as recited in claim 10 further comprising:

press fitting said upper portion to said module.

12. The method as recited in claim 10, wherein the upper portion projects in a first direction from the transition portion and the lower portion projects in a second, opposite direction from the transition portion.

13. A method, comprising:

connecting a module to a board;

placing an upper portion of an electrically conductive grounding strip over said module;

spanning a distance between said upper portion and said board with a transition portion of said grounding strip;

contacting a grounding pad on said board with a lower portion of said grounding strip; and providing tabs on said lower portion to fit into registration holes in said grounding pad.

14. A method, comprising:

connecting an module to a board;

placing an upper portion of an electrically conductive grounding strip over said module;

spanning a distance between said upper portion and said board with a transition portion of said grounding strip; and contacting a grounding pad on said board with a lower portion of said grounding strip; and creasing an area of said grounding strip between said upper portion and said transition portion.

15. The method as recited in claim 14, further comprising:

creasing an area of said grounding strip between said transition portion and said lower portion.

16. The method as recited in claim 15, further comprising:

perforating said creased area of said grounding strip between said transition portion and said lower portion.

17. The method as recited in claim 14, further comprising:

perforating said creased area of said grounding strip between said upper portion and said transition portion.

18. An optical transceiver system, comprising:

a board;

an optical transmitter connected to said board;

an optical receiver connected to said board;

a first grounding strip comprising a upper portion to fit over a top of said optical transmitter, a transition portion to span a distance between the top of said optical transmitter and said board, and a lower portion in electrical connection with a first grounding pad on the board;

a second grounding strip comprising a upper portion to fit over a top of said optical receiver, a transition portion to span a distance between the top of said optical receiver and said board, and a lower portion in electrical connection with a second grounding pad on the board.

19. The optical transceiver system as recited in claim 18, further comprising:

thermal pads between said first grounding strip and said second grounding strip and a cover of said optical transceiver.

20. The optical transceiver system as recited in claim 19, wherein said first and second grounding strips each comprising:

a first crease area between said upper portion and said transition portion;

a second crease area between said transition portion and said lower portion.

21. The optical transceiver system as recited in claim 20 wherein said first and second grounding strips each further comprise:

perforations in at least one of said first crease area and said second crease area.

22. The optical transceiver system as recited in claim 18 wherein said first and second grounding strips each further comprise:

tabs to fit in registration holes in said first and second grounding pads.

* * * * *